(12) United States Patent
Frosien et al.

(10) Patent No.: US 9,035,249 B1
(45) Date of Patent: May 19, 2015

(54) MULTI-BEAM SYSTEM FOR HIGH THROUGHPUT EBI

(71) Applicant: ICT Integrated Circuit Testing Gesellschaft für Halbleiterprüftechnik GmbH, Heimstetten (DE)

(72) Inventors: Jürgen Frosien, Riemerling (DE);
Dieter Winkler, Munich (DE);
Benjamin John Cook, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/174,651

(22) Filed: Feb. 6, 2014

(30) Foreign Application Priority Data

Dec. 2, 2013 (EP) .................................... 13195345

(51) Int. Cl.
*H01J 37/28* (2006.01)
*H01J 37/244* (2006.01)
*H01J 37/147* (2006.01)

(52) U.S. Cl.
CPC ............. *H01J 37/28* (2013.01); *H01J 37/1474* (2013.01); *H01J 37/244* (2013.01); *H01J 2237/21* (2013.01); *H01J 2237/2448* (2013.01); *H01J 2237/2806* (2013.01)

(58) Field of Classification Search
CPC ....... H01J 37/244; H01J 37/28; H01J 37/147; H01J 37/09; H01J 37/1471; H01J 37/045; G01N 23/225; G01N 23/23; G01N 23/2251

USPC ...... 250/310, 307, 306, 311, 396 R, 396 ML, 250/398

See application file for complete search history.

(56) References Cited

U.S. PATENT DOCUMENTS 6,825,476 B2 * 11/2004 Adamec ......................... 250/398
6,855,929 B2 * 2/2005 Kimba et al. ..................... 850/9
(Continued)

FOREIGN PATENT DOCUMENTS

EP 1150327 A1 10/2001
EP 2365514 A1 9/2011

OTHER PUBLICATIONS

Extended European Search Report for European Application 13195345.7-1556 dated Apr. 22, 2014.

*Primary Examiner* — David A Vanore
(74) *Attorney, Agent, or Firm* — Patterson & Sheridan, LLP

(57) ABSTRACT

A scanning charged particle beam device configured to image a specimen is described. The scanning charged particle beam device includes a source of charged particles, a condenser lens for influencing the charged particles, an aperture plate having at least two aperture openings to generate at least two primary beamlets of charged particles, at least two deflectors, wherein the at least two deflectors are multi-pole deflectors, a multi-pole deflector with an order of poles of 8 or higher, an objective lens, wherein the objective lens is a retarding field compound lens, a beam separator configured to separate the at least two primary beamlets from at least two signal beamlets, a beam bender, or a deflector or a mirror configured to deflect the at least two signal beamlets, wherein the beam bender is a hemispherical beam bender or beam bender having at least two curved electrodes, and at least two detector elements.

20 Claims, 10 Drawing Sheets

(56) References Cited

U.S. PATENT DOCUMENTS

| | | | |
|---|---|---|---|
| 7,049,585 B2 * | 5/2006 | Nakasuji et al. | 250/310 |
| 7,335,894 B2 * | 2/2008 | Frosien et al. | 250/396 R |
| 7,439,500 B2 * | 10/2008 | Frosien et al. | 250/305 |
| 7,504,624 B2 * | 3/2009 | Kawasaki et al. | 250/310 |
| 7,550,740 B2 * | 6/2009 | Takeuchi et al. | 250/396 ML |
| 7,557,347 B2 * | 7/2009 | Shojo et al. | 250/310 |
| 7,906,761 B2 * | 3/2011 | Tanimoto et al. | 250/310 |
| 7,932,495 B2 * | 4/2011 | Adamec | 250/307 |
| 8,164,067 B2 * | 4/2012 | Adamec et al. | 250/397 |
| 8,330,103 B2 * | 12/2012 | Enyama et al. | 250/310 |
| 8,378,299 B2 * | 2/2013 | Frosien | 250/311 |
| 8,530,837 B2 * | 9/2013 | Adamec | 250/310 |
| 8,618,500 B2 * | 12/2013 | Adamec | 250/398 |
| 8,723,117 B2 * | 5/2014 | Lanio et al. | 250/310 |
| 8,890,096 B2 * | 11/2014 | Li et al. | 250/492.22 |
| 2009/0248506 A1 | 10/2009 | Goldstein et al. | |
| 2010/0320382 A1 * | 12/2010 | Almogy et al. | 250/307 |
| 2011/0272576 A1 | 11/2011 | Otaki et al. | |

\* cited by examiner

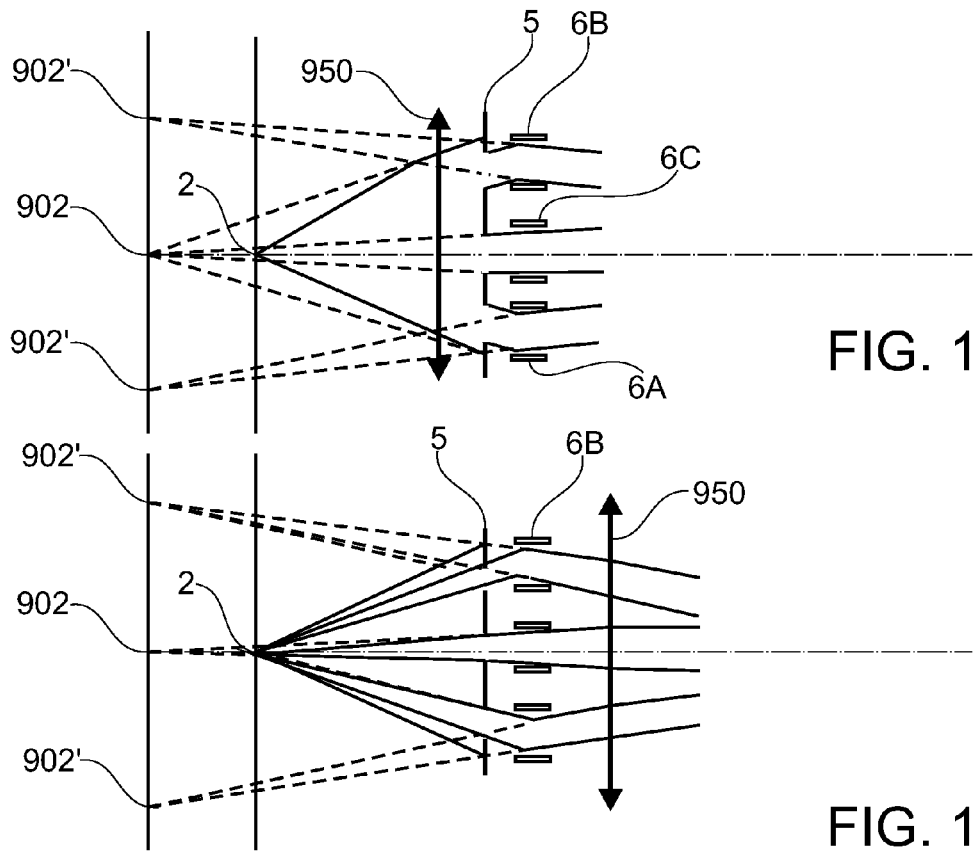
FIG. 12A
FIG. 12B
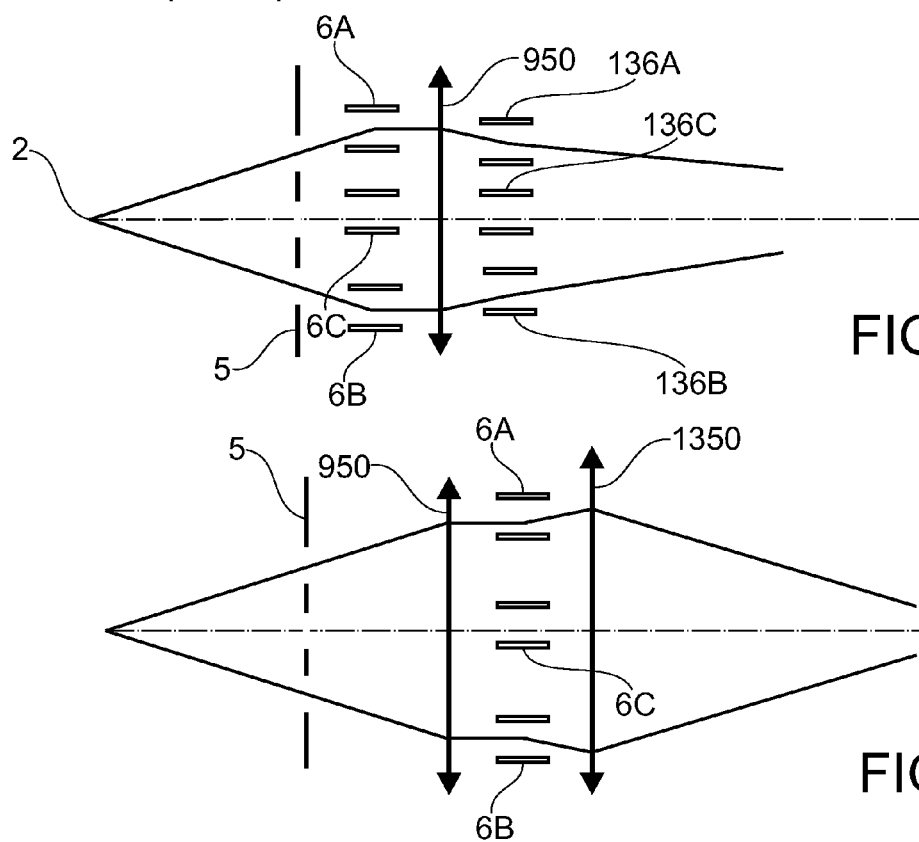
FIG. 13A
FIG. 13B

MULTI-BEAM SYSTEM FOR HIGH THROUGHPUT EBI

FIELD OF THE INVENTION

Embodiments of the invention relate to charged particle beam devices, for example, for inspection system applications, testing system applications, defect review or critical dimensioning applications or the like. It also relates to methods of operation thereof. More particularly, embodiments relate to charged particle beam devices being multi-beam systems for high throughput EBI. Specifically, embodiments relate to a scanning charged particle beam device and a method of electron beam inspection with a scanning charged particle beam device.

BACKGROUND OF THE INVENTION

Modern semiconductor technology is highly dependent on an accurate control of the various processes used during the production of integrated circuits. Accordingly, the wafers have to be inspected repeatedly in order to localize problems as early as possible. Furthermore, a mask or reticle should also be inspected before its actual use during wafer processing in order to make sure that the mask accurately defines the desired pattern. This is done because any defects in the mask pattern will be transferred to the substrate (e.g., wafer) during its use in microlithography. However, the inspection of wafers or masks for defects requires the examination of the whole wafer or mask area. Especially, the inspection of wafers during their fabrication requires the examination of the whole wafer area in such a short time that production throughput is not limited by the inspection process.

Scanning electron microscopes (SEM) have been used to inspect wafers to detect pattern defects. Thereby, the surface of the wafer is scanned using e.g. a single finely focused electron beam. When the electron beam hits the wafer, secondary electrons and/or backscattered electrons, i.e. signal electrons, are generated and measured. A pattern defect at a location on the wafer is detected by comparing an intensity signal of the secondary electrons to, for example, a reference signal corresponding to the same location on the pattern. However, because of the increasing demands for higher resolutions, a long time is required to scan the entire surface of the wafer. Accordingly, it is difficult to use a conventional (single-beam) Scanning Electron Microscope (SEM) for wafer inspection, since this approach does not provide the required throughput.

Wafer and mask defect inspection in semiconductor technology needs high resolution and fast inspection tools, which cover both full wafer/mask application or hot spot inspection. A hot spot inspection refers to an imaging application, wherein only imaging of sensitive areas, which have increased defect potential, is conducted. Presently light optical inspection tools are widely spread for those applications. However, electron beam inspection gains increasing importance because of the limited resolution of light optical tools, which cannot follow the requirements coming along with shrinking defect sizes. In particular, from the 20 nm node and beyond, the high-resolution potential of electron beam based imaging tools become more important to detect all defects of interest. In particular, topographic defects are of special interest and importance.

One drawback of e-beam based optics, e.g. SEM based systems, is the limited probe current within the focused spot. With increasing resolution (decreasing spot size), probe current is further decreasing because of a reduced aperture angle required to control the lens aberrations. Higher brightness sources can provide only limited improvements for the probe current (probe current density) because of the electron-electron interaction. The electron-electron interaction blurs the focused spot and increases the energy width, which again increases the probe diameter, e.g. by introduction of further chromatic aberrations. Consequently, many approaches have been made to reduce e-e interaction in electron beam systems, which are, for example, reduced column length and/or higher column energy combined with late deceleration of the electron beam to the final landing energy just in front of the sample.

Many previous designs gave significant improvements. However, these improvements are still not sufficient to provide a reasonable inspection time for 300 mm diameter wafers. For example, the inspection time should be below 1 hour. Additionally each reduction in defect size by a factor of 2 also requires a spot size reduction by a factor of 2. This results in an increase of pixel numbers by a factor of 4. Such an increase in pixel count reduces the throughput by at least a factor of 4, which is even further reduced by the fact that a smaller electron probe results in a reduced spot current due to a smaller aperture angle, which is required by the aberrations of the lenses involved.

One approach to solve such problems is the use of multiple beams within one column, which reduces the throughput by the number of beams. In order to perform this task using electron microscopic techniques several approaches have been suggested. One approach is based on the miniaturization of SEMs, so that several miniaturized SEMs (in the order of ten to one hundred) are arranged in an array and each miniaturized SEM examines a small portion of the complete sample surface.

Electron beam lithography faces similar throughput limitation to get reasonable writing times. Electron beam lithography also considers multi-beam approaches. However, e-beam lithography applications cannot be implemented for e-beam inspection in light of different boundary conditions, which avoid problems occurring for e-beam inspection. For electron beam lithography, the beam energy is higher as compared to inspection (lithography 50 keV-100 keV, inspection typically 100 eV-5 keV). The higher beam energy reduces the impact of e-e interaction. Additionally, no detection is needed from the surface images produced by the individual beams. For example, multi-beam electron projection/lithography systems are used to create patterns of variable shape on a substrate by switching on and off individual beams. However, beyond the different boundary conditions mentioned above, there are also differences in the devices. For example, an aperture or aperture array is focused on the sample, on which the pattern is generated.

Accordingly, there is a need for an imaging charged particle beam device which provides a sufficient resolution and which is able to increase the data collection to such an extent that the device can also be applied to high speed wafer inspection.

SUMMARY OF THE INVENTION

In light of the above, a charged particle beam device and a method of imaging a specimen or wafer are provided. Further aspects, advantages, and features of the present invention are apparent from the dependent claims, the description, and the accompanying drawings.

According to one embodiment, a scanning charged particle beam device configured to image a specimen is provided. The scanning charged particle beam device includes a source of charged particles, a condenser lens for influencing the charged particles, an aperture plate having at least two aperture openings to generate at least two primary beamlets of charged particles, at least two deflectors configured to individually deflect the at least two primary beamlets of charged particles so that each primary beamlet appears to come from a different source, wherein the at least two deflectors are multi-pole deflectors with an order of poles of 8 or higher, a multi-pole deflector with an order of poles of 8 or higher, an objective lens configured to focus the at least two primary beamlets onto the specimen, wherein the objective lens is a retarding field compound lens, a beam separator configured to separate the at least two primary beamlets from at least two signal beamlets, a beam bender, or a deflector or a mirror configured to deflect the at least two signal beamlets, wherein the beam bender is selected from the group consisting of: a hemispherical beam bender and a beam bender having at least two curved electrodes, and at least two detector elements configured to individually measure the at least two signal beamlets.

According to another embodiment, an arrayed scanning charged particle beam device is provided. The device includes at least two scanning charged particle beam devices, for example at least 5 scanning charged particle beam devices, or even at least 10 scanning charged particle beam devices. Each of the scanning charged particle beam devices includes a source of charged particles, a condenser lens for influencing the charged particles, an aperture plate having at least two aperture openings to generate at least two primary beamlets of charged particles, at least two deflectors configured to individually deflect the at least two primary beamlets of charged particles so that each primary beamlet appears to come from a different source, wherein the at least two deflectors are multi-pole deflectors with an order of poles of 8 or higher, a multi-pole deflector with an order of poles of 8 or higher, an objective lens configured to focus the at least two primary beamlets onto the specimen, wherein the objective lens is a retarding field compound lens, a beam separator configured to separate the at least two primary beamlets from at least two signal beamlets, a beam bender, or a deflector or a mirror configured to deflect the at least two signal beamlets, wherein the beam bender is selected from the group consisting of: a hemispherical beam bender and a beam bender having at least two curved electrodes, and at least two detector elements configured to individually measure the at least two signal beamlets.

Embodiments are also directed methods by which the described apparatus operates. It includes method steps for carrying out every function of the apparatus. These method steps may be performed by way of hardware components, a computer programmed by appropriate software, by any combination of the two or in any other manner.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIGS. 12A and 12B show schematic views of arrangements of an aperture plate, individual deflectors and a condenser lens;

FIGS. 13A and 13B show schematic views of arrangements of an aperture plate, individual deflectors and a condenser lens or condenser lenses, respectively.

DESCRIPTION OF THE PREFERRED EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles. As described herein, discussions and descriptions relating to the detection are exemplarily described with respect to electrons in scanning electron microscopes. However, other types of charged particles, e.g. positive ions, could be detected by the device in a variety of different instruments.

According to embodiments herein, which can be combined with other embodiments, a signal beam is referred to a beam of secondary particles or a secondary beam, i.e. secondary and/or backscattered particles. Typically, the signal beam or secondary beam is generated by the impingement of the primary beam on a specimen. A primary beam is generated by a charged particle beam source and is guided and deflected on a specimen to be inspected or imaged.

A "specimen" as referred to herein, includes, but is not limited to, semiconductor wafers, semiconductor workpieces, photolithographic masks and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications.

Figure 1A:
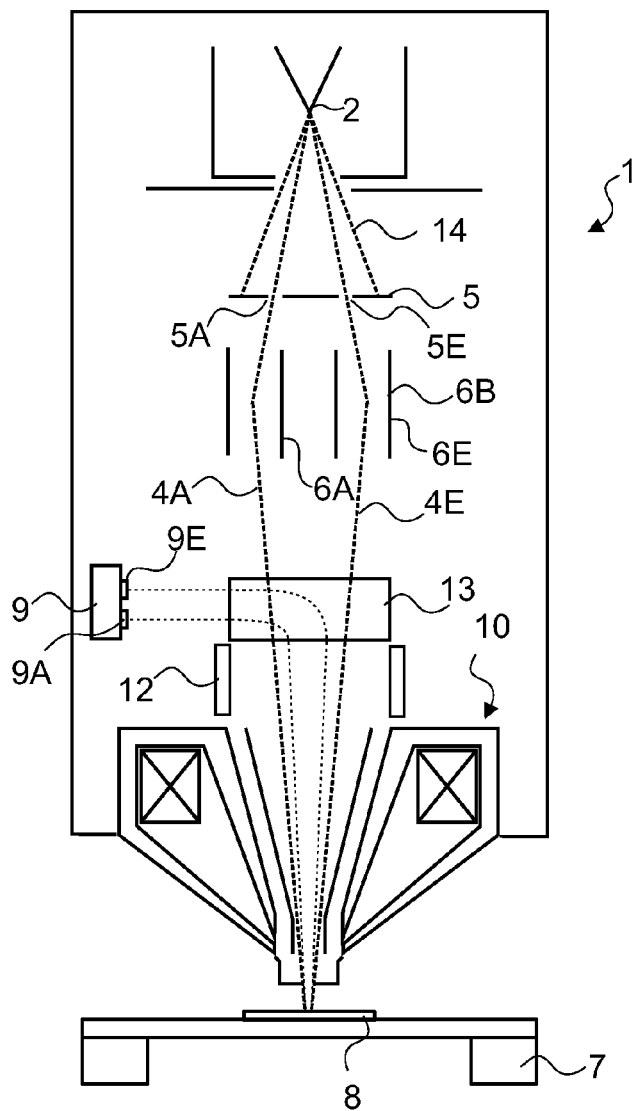
FIGS. 1A and 1B show schematically a column according to one embodiment according to the present invention.
Figure 1B:
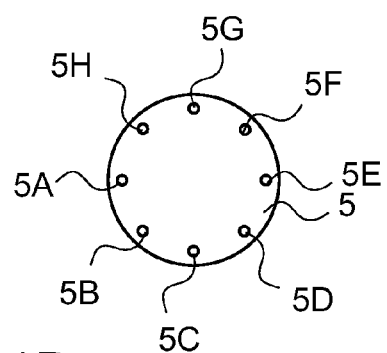

An embodiment according to the invention is shown schematically in FIGS. 1A and 1B. The column 1 for a charged particle beam device comprises a charged particle source 2, which emits a beam 14 of charged particles. The charged particles are accelerated by an accelerating voltage supplied to the charged particle source 2.

As described herein, a cold field emitter (CFE), a Schottky emitter, a TFE or another high current e-beam source is provided, e.g. to increase the throughput. Thereby, a high current is considered to be 10 μA in 100 mrad or above, for example up to 5 mA, e.g. 30 μA in 100 mrad to 1 mA in 100 mrad, such as about 300 to in 100 mrad. According to typical implementations, the current is distributed essentially uniform, e.g. with a deviation of +−10%, particularly in the case of a linear or rectangular array. According to some embodiments, which can be combined with other embodiments described herein, the source or virtual source can have a diameter of 2 nm to 40 nm and/or have a typical emission half angle of 5 mrad or above, e.g. 50 mrad to 200 mrad.

According to yet further embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 μA-100 μA, for example 30 μA.

Schottky or TFE emitters are currently available with a measured reduced-brightness of $5\cdot10^7$ $Am^{-2}(SR)^{-1}V^{-1}$, CFE emitters have a measured reduced-brightness of up to $5\cdot10^9$ $Am^{-2}(SR)^{-1}V^{-1}$. The system may also work with a carbide emitter such as a HfC which can have a reduced brightness of approximately $1\cdot10^{11}$ $Am^{-2}(SR)^{-1}V^{-1}$. For example, a beam, which has at least $5\cdot10^7$ $Am^{-2}(SR)^{-1}V^{-1}$ is beneficial.

After leaving the charged particle source 2, the charged particle beam 14 passes through an aperture plate 5 having multiple aperture openings 5A-5E. The aperture openings can be situated along a ring on the aperture plate 5 or along any other arrangement such as a line, rectangle, or square. By passing through the aperture plate 5, multiple charged particle beams 4A-4E are created. Thereafter, deflectors 6A to 6E are provided to influence the beams of charged particles 4A-4E so that each beam 4A-4E appears to come from a different source.

Thereafter, the charged particle beams 4A-4E, i.e. the primary charged particle beams or beamlets, pass a beam separator assembly 13, which is configured to separate the primary beams for secondary beams or backscattered beams, i.e. signal beams.

Thereafter, the charged particle beams 4A-4E, i.e. the primary charged particle beams or beamlets, pass the scanning deflector 12, which is, for example, used to move the charged particle beams 4A-4E in a raster over the surface of the specimen 8. After the scanning deflector 12, the charged particle beams 4A-4E enter the objective lens 10 that focuses the charged particle beams 4A-4E onto the specimen 8. The objective lens 10 not only focuses the charged particle beams 4A-4E but also rotates the charged particle beams 4A-4E. However, this effect is not shown because it is difficult to depict in a two-dimensional drawing and because the skilled person is well aware of this additional effect. Due to the combined effects of the deflectors 6A-6E and the objective lens 10, multiple spots (images of the particle source 2), each corresponding to one of the charged particle beams 4A-4E, are created on the specimen 8.

When the particles of beams 4A-4E strike the surface of the specimen 8, they undergo a series of complex interactions with the nuclei and electrons of the atoms of the specimen. The interactions produce a variety of secondary products, such as electrons of different energy, X-rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (1 to 50 eV). The signal electrons are extracted from the specimen through the objective lens 10, are separated from the primary beams in the beam separator assembly 13, and reach the detector assembly 9. The detector assembly 9 includes detector elements 9A-9E, which are configured for generation of a measurement signal, e.g. an electronic signal corresponding to the detected signal electrons.

By scanning the charged particle beams 4A-4E over the specimen and displaying/recording the output of the detector assembly 9 or detector elements 9A-9E, multiple independent images of the surface of the specimen 8 are generated. Each image contains information about a different portion of the surface of the specimen. Accordingly, the speed of the data acquisition is increased by a factor 8 with regard to the conventional single beam case. The specimen 8 is supported on a stage 7 (specimen support) which is moveable horizontally in all directions, in order to allow the charged particle beams 4A-4H to reach the target areas on the specimen which are to be examined. The stage can also move in 1-direction while the beams are scanned in a second direction. This will improve throughput further, since no stage settling time is required.

In order to improve the performance of the system, the embodiment shown in FIG. 1A contains an objective lens 10, which is a combination of a magnetic lens and an electrostatic lens. Accordingly, the objective lens 10 is a compound magnetic-electrostatic lens. Preferably, the electrostatic part of the compound magnetic-electrostatic lens 10 is an electrostatic retarding lens. Using such a compound magnetic-electrostatic lens 10 yields superior resolution at low landing energies, such as a few hundred electron volts in the case of a SEM. Such low landing energies are desirable, especially in modern semiconductor industry, to avoid charging and/or damaging of radiation sensitive specimens. However, the benefits of the present invention are also achieved if only a magnetic lens or only an electrostatic lens is used.

According to embodiments described herein, a multi beamlet column is provided with a number of beams, such as 2 or more or 5 or more, preferably larger than 8 and, according to some examples up to 200. The multi-beamlet column is configured such that it can also be arrayed in a multi-column system. Arraying multiple columns then provides an even higher number of probes, i.e. beamlets, working on the same sample (e.g. a wafer or a mask).

According to embodiments described herein, the primary electron beams and the secondary or signal electron beams are separated; particularly the signal electron detection is conducted off-axis, i.e. off-axis with respect to the optical axis defined by the objective lens. Thereby, an efficient detection with negligible crosstalk between the different signals and a small or no effect on the primary beam performance can be provided. According to yet further embodiments, which can be combined with other embodiments described herein, the pitch of the primary beams or beamlets on the sample is large enough that the pitch of the signal-electron-beamlet is sufficient such that the signal electron detection can be performed without or at least with neglectable crosstalk. For example the pitch on the specimen, e.g. a wafer, i.e. a minimal distance between two primary beams on the specimen, can be 10 µm or above, for example 40 µm to 100 µm. Accordingly, embodiments provide a multi-beam device which generates a reasonable number of primary electron beamlets within one electron optical column, wherein crosstalk is reduced, and which optionally provides the opportunity to array several of the multi-beam devices, i.e. multiple of the columns. Accordingly, it is further desired to have the option to array multi beamlet columns in a multi-column module (MCM).

Figure 2:
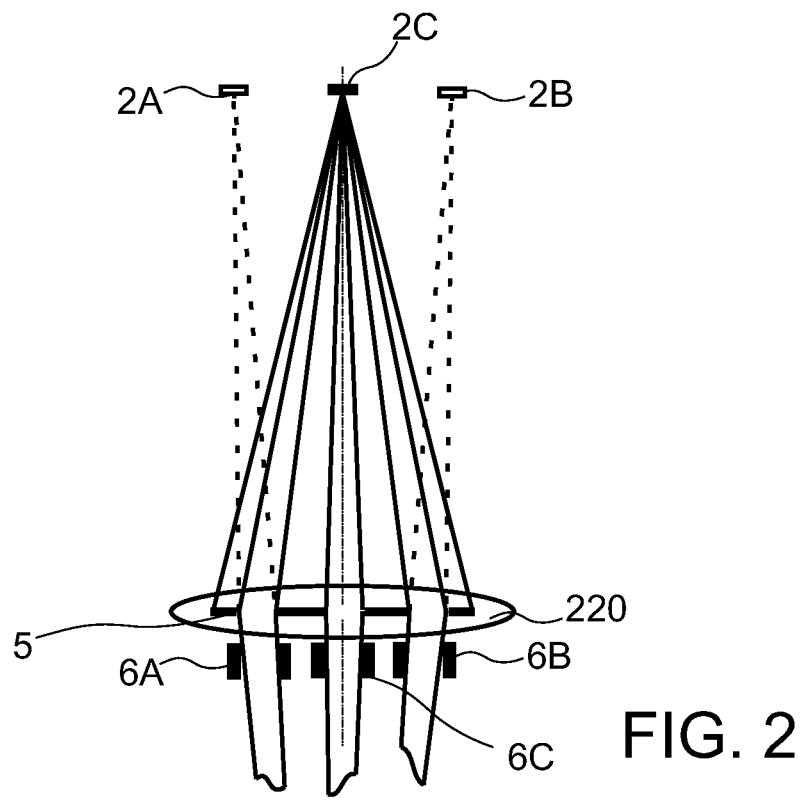
FIG. 2 shows a schematic view of source multiplication with an aperture plate and individual deflectors according to embodiments described herein.

Further details of embodiments described herein will now be explained with respect to FIG. 2. An electron source 6C is provided. For example, a cold field emitter, a TFE or a Schottky emitter is provided. A multiplication of the source is provided by a plurality of aperture openings, e.g. aperture openings 6A to 6C shown in FIG. 2, in an aperture plate 5 followed by individual deflectors, e.g. deflectors 6A to 6C shown in FIG. 2. The control of individual deflectors results in individual beam paths and beam correction options. Embodiments according to the invention provide the advantage that an optimized single beam column can be expanded into a multi-beam optics without major changes of the column. Particularly, the column length does not need to be extended. According to embodiments described herein, which can be combined with other embodiments described herein, the column length, i.e. the length from the emitter tip to the specimen table, can be 100 mm to 450 mm.

The aperture plate 5 is illuminated by the electron source 6C directly or via a condenser lens 220. In particular a homogeneous emission area of a TFE source can be used which has an half-angle of 10° or below, e.g. of about 5°. Behind each aperture opening 5A-5C in the aperture plate 5, the individual deflectors 6A to 6C are realized by multi-pole elements, which are at least 4th order (quadrupole). According to some embodiments, the multi-pole elements can be manufactured by conventional mechanical machining. However, according to particular embodiments, which can be combined with other embodiments described herein, microelectromechanical systems (MEMS) technology deflector elements can be beneficial, because this allows a higher multi-pole density and eases the wiring of the electrodes.

According to some embodiments, it is preferred to provide an octupole or even higher order element as deflector elements for embodiments herein. Thereby, for example, each of these multi-poles such as octupoles or even higher order multi-poles, has an electrical supply, which can generate a lens function (common voltage on all electrodes), a deflection function in the x- and y-direction (electrical field in a plane vertical to the optical axis) and a stigmatism function to control the astigmatism of each beamlet (2 electrical quadrupoles rotated by 45°). Optionally an electrical hexapole can be provided either by an additional supply on the octupole, or by the integration of a higher order multi-pole (e.g. 12-pole). Such an arrangement provides the following compensation options: a control of the field curvature on the sample surface, a deflection of each beamlet to penetrate through the center of the objective lens to avoid/reduce coma or at least to pass the z-axis closely in front of the objective lens to reduce coma, a slightly different z-axis crossing can be achieved which smears the cross-over and reduces e-e interaction by the individual deflection, a fine adjustment of the deflection of each beam can be provided to be centered to the optical axis of the objective lens which guarantees best performance because it eliminates imperfections of the objective lens, and an independent control/correction of astigmatism in each beamlet (potentially also of hexapole) can be provided. An individual beam blanking can be provided in the event that a beam blanking aperture is provided within the beam path, e.g. in or near the cross-over plane.

An embodiment according to the invention further provides a multi-aperture plate with one or more of the following features. Such a multi-aperture plate can be beneficially used in other embodiments relating to charged particle beam columns, systems including arrays of charged particle beam columns and methods of operating charged particle beam columns. Typically, the design of the multi-aperture plate has to follow different criteria and has to be treated in the context of the overall electron optical ray path design. The number of aperture openings is a compromise between largest possible total current and optical performance, in particular achievable spot size in the largest possible beamlet field. Another boundary condition is the beamlet separation on the sample, which is required to assure a signal beamlet separation on the detectors, wherein crosstalk should be reduced or avoided. According to typical embodiments, one dimensional (line) arrays or 2-dimensional arrays (e.g. 4×4, 3×3, 4×4, 5×5) or asymmetrical arrays e.g. 2×5 can be provided. According to yet further embodiments, which can be combined with other embodiments described herein, the grid configuration is provided to allow for a complete coverage of the substrate surface during a scan. This is not limited to a pure electron beam scan, e.g. in the x-y-direction, but also includes a mixed scan operation like beam scan, e.g. in a first direction, such as the x-direction, and a stage movement in another direction different from the first direction, such as the y-direction.

Figure 3:
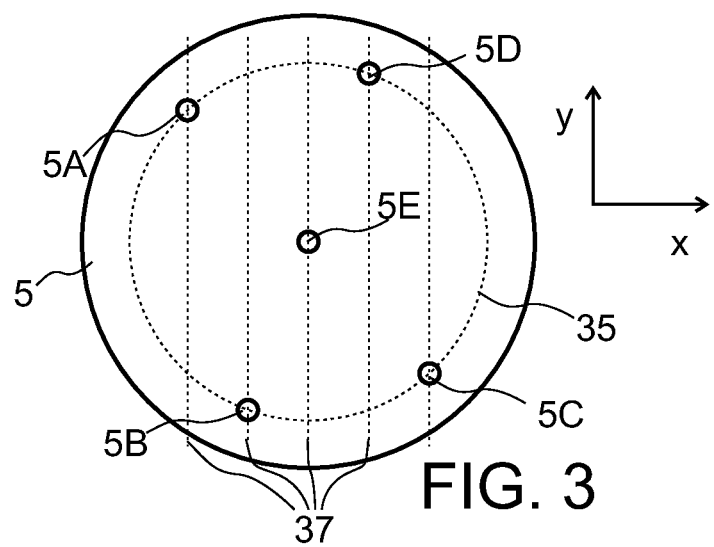
FIG. 3 shows a schematic view of an aperture plate having a plurality of aperture openings according to an embodiment of the invention, which can be used in other embodiments described herein.

Exemplarily, FIG. 3A shows a five-beam-arrangement. Thereby, the aperture openings 5A to 5D are located on a circle 35, which is beneficial from the aspect of aberrations. Further, the aperture openings 5A to 5E are located on lines 37. For example, an electron beam scan can be conducted in the x-direction and a movement of the specimen stage can be conducted in the y-direction. Thereby, the distance of the lines 37 can be provided to correspond to the field of view on the specimen, wherein two or more of the beamlets generated based upon the aperture openings utilize the same, i.e. the maximum, field of view. A full coverage of a scan area can be provided while the aperture openings have the same distance from the optical axis. The embodiment shown in FIG. 3 provides a beamlet arrangement with a rotational symmetry, which is beneficial from the aspect of aberrations. Further, each line 37 corresponds to one aperture opening only, wherein the lines are typically equidistant. According to some embodiments, the aperture openings are located on a circle having a center at an optical axis, the aperture openings are located on equidistant lines, and the aperture openings have a maximized distance from each other when located on the circle and the lines. Further, the aperture plate can be rotationally symmetric. This principle shown in FIG. 3 with 5 aperture openings can further be extended to 7, 9, 11, or 13 or another uneven number of aperture openings.

Figure 4:
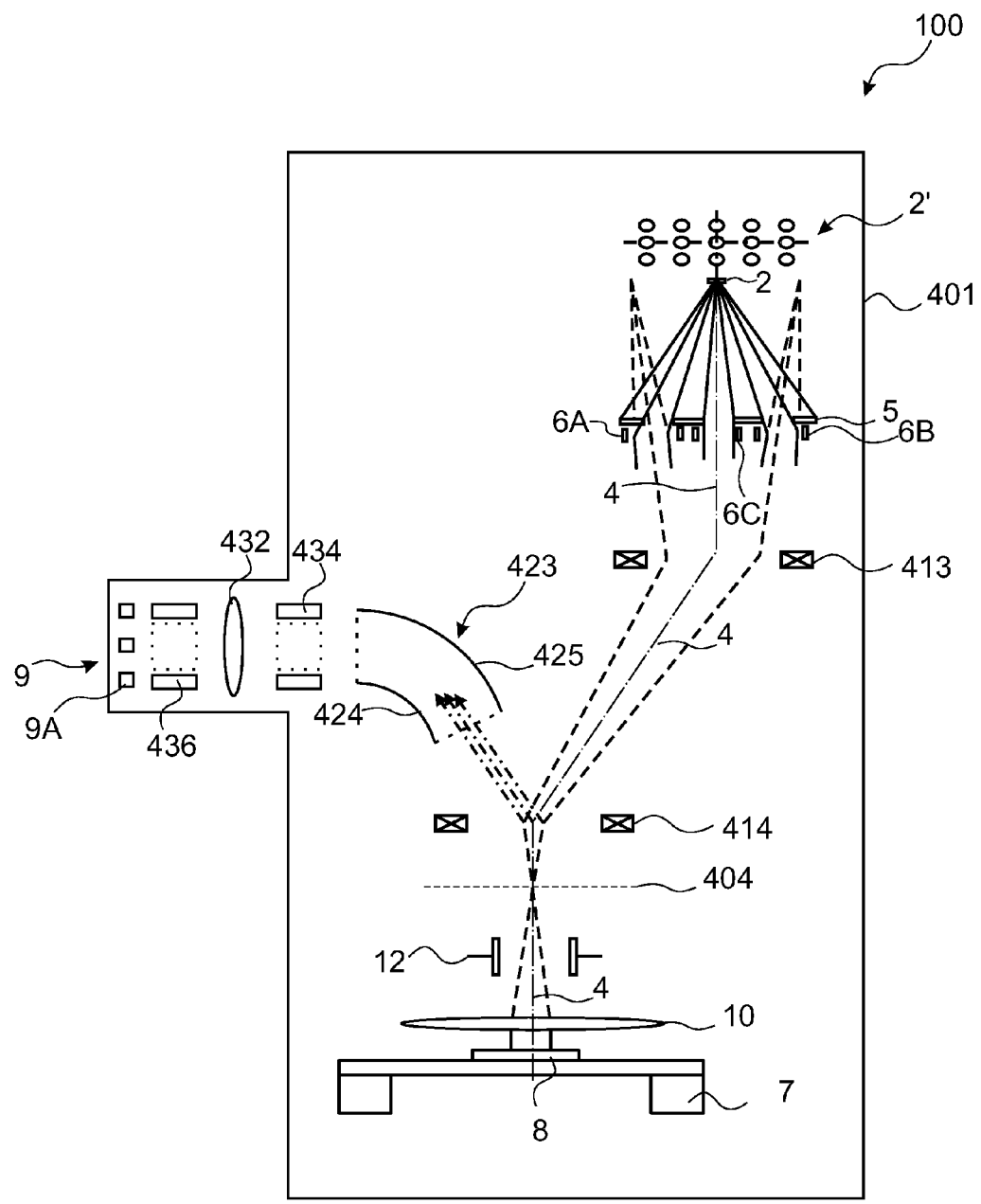
FIG. 4 shows a schematic view of a charged particle beam device having an aperture plate, individual deflectors and a scanning deflector according to embodiments described herein.

FIG. 4 shows another charged particle beam device 100 illustrating embodiments described herein. The charged particle beam device 100 has a column with a column housing 401. A charged particle source 2, for example an electron beam source, such as a field emitter, emits an electron beam. A condenser lens (not shown in FIG. 4) can be included according to any of the embodiments described herein. The charged particle beam passes through an aperture plate 5 having a plurality of aperture openings. A plurality of the deflectors are provided to influence the beamlets having passed through the aperture openings. FIG. 4 shows deflectors 6A, 6B, and 6C. The individual deflectors influence the beamlets such that a plurality of virtual electron sources are provided, i.e. the electrons of the beamlets appear to be emitted from different locations in a plane of the charged particle beam source perpendicular to the optical axis 4. In the example shown in FIG. 4, an array of 3×5 sources (see schematic array 2') are provided. Thereby, the center source corresponds to the charged particle beam source 2. The other 14 sources are virtual sources with an off-set in a plane perpendicular to the optical axis. According to some embodiments, which can be combined with other embodiments described herein, a beam separator, i.e. a separator separating the primary beams from the signal beams, can be provided by magnetic deflectors 413 and 414. The scanning deflector 12 scans the beam over the surface of the specimen 8. The primary beamlets, i.e. the plurality of beams, which appeared to be emitted from the array 2', are focused on the specimen 8 by a common objective lens 10. Thereby, according to typical embodiments, which can be combined with other typical embodiments described herein, all of the primary beamlets pass through one opening in the objective lens 10. The specimen 8 is provided on the specimen stage 7, which can move the specimen 8 in at least one direction perpendicular to the optical axis 4.

According to some embodiments, which can be combined with other embodiments described herein, the objective lens can be an electrostatic magnetic component lens, particularly having an electrostatic compound that reduces the energy within the column from a high energy within the column to a lower landing energy. Typically, the energy reduction from the column energy to the landing energy is at least a factor of 10, for example at least a factor of 30.

Further, a retarding field including a potential provided to the specimen can be provided. According to yet further implementations, which can be combined with other embodiments described herein, a configuration, in which the column is at ground potential and the charged particle source 2 and the specimen 8 are at a high potential can be provided. Thereby most or all of the column components can be provided at ground potential. Accordingly control of deflectors, scanners, detectors, etc. as well as charging of other components such as the aperture plate 5, can be improved.

For example, the primary beamlets can travel through the column at 20 keV or above, e.g. at 25 keV, even 30 keV, or even higher energy. Thereby, exemplarily for a 25 keV beam energy, the emitter or the emitter tip, respectively, can be at −25 kV and the extractor or typically the anode and the column is at ground. According to embodiments described herein, the column energy is sometimes associated with the extractor potential and/or the anode potential. In many applications, the extractor potential and the anode potentials can be the same potential or the anode can even be provided by the extractor. However, there are applications, where the extractor and the anode are on different potentials. In such a case, the column energy is typically determined by the anode potential.

According to typical embodiments, which can be combined with other embodiments described herein, the column can typically be at ground potential or can be at least from −8 kV to +8 kV, typically from −2 kV to +2 kV. Even though it can be understood by a person skilled in the art, that the beam energy is based on relative potentials, such that alternatively the emitter could be at ground or any other value and the column voltage could be at +25 kV or a corresponding other value for the above example having a beam energy of 25 keV, having the column potential at ground or within a limited range around ground can be considered beneficial for EBI systems according to embodiments described herein. Beyond the aspects relating to the energy of the primary electron beam and the corresponding potentials of the electrostatic lens components, wherein a retarding field lens is provided, other aspects are also to be considered.

For good performance of the system, primary beam deflection for alignment, primary beam deflection for scanning, and detection of signal electrons, such as secondary electrons (SE) or backscattered electrons, are additionally to be considered and improved. Having the column potential at ground potential or at least at a limited potential avoids having additional components like alignment deflectors, scan deflectors and elements for SE detection at a high potential or at least at very high potentials, e.g. 25 kV, which is provided in addition to the control signals of these components and elements. Providing these components at high potentials would result in inferior control thereof and a resulting inferior performance of the system.

According to typical embodiments described herein, the column energy, i.e. the energy at which the electrons travel through the column is above 20 keV, such as 25 keV or 30 keV. However, according to yet further modifications, which can be combined with other embodiments described herein, the column energy can also be at even higher potentials such as 40 keV or above or even 50 keV or above. Thereby, the landing energies on the wafer or specimen are not increased, but instead the immersion factor is increased, i.e. the electrons are decelerated more.

In the context of the here described embodiments, without limiting the scope of protection thereto, an intermediate beam acceleration system intends to describe a charged particle beam apparatus with initial high acceleration of the charged particles which will be decelerated to a landing energy shortly before striking the specimen or wafer. The energy or velocity ratio $v_{acc}/v_{landing}$ between the acceleration velocity $v_{acc}$ at which the charged particles are guided through the column and the landing velocity $v_{landing}$ at which the charged particles strike the specimen can be about at least 10 or higher, e.g. 20 or higher. Furthermore, the landing energy can be 2 keV or less, e.g. 1 keV or less, such as 500 eV or even 100 eV.

As for example shown in FIG. 4, all primary beamlets are scanned across the surface of the specimen 8 by a common scan deflector 12. According to typical embodiments, which can be combined with other embodiments described herein, this scanning deflector 12 can be within the objective lens or close to the objective lens. For example, the lower stage scanning deflector should be within 5-times of the focal length of the objective lens or less. The scan deflector 12 can also be a 2-stage deflector. According to yet further embodiments, which can be combined with other embodiments described herein, the scanning deflector 12 can be an electrostatic and/or magnetic octupole. Thereby, the scan deflector can be used not only for scanning but also for a global astigmatism correction of the objective lens and a potential contribution of a condenser lens if provided. Typically, in light of a high throughput requirement, an electrostatic scan system is beneficially provided. An octupole scan deflector can further provide dynamic correction functions, typically all dynamic correction functions, which are needed within the scan field, for example, focus adjustment and astigmatism correction. The dynamic scan field correction can be done commonly for the primary beamlets because field curvature and coma correction can already be corrected by the individual deflectors, e.g. deflectors 6A, 6B and 6C shown in FIG. 4.

Embodiments described herein allow a simple approach to generate multiple electron beams, which can be arrayed and optically improved according to the desired resolution requirements. Particularly, a complex multi-lens array, i.e. an area of Einzel lenses, can be avoided. Further, utilizing multiple aperture arrays, which require a beam deceleration in the column to generate an immediate spot grid array, can be avoided. The individual deflectors, for example deflectors 6A, 6B and 6C shown in FIG. 4, allow for individual influencing of each beamlet to achieve improved optical probe performance of the electron beam probes reaching the sample surface. Yet further, embodiments allow for an improved and/or predetermined separation of the primary beamlets, such that an effective separation of the primary beamlets and the secondary beamlets allow for detection of the signal electrons of each signal beam without significant crosstalk. Yet further, the combination of individual deflectors and common deflectors, wherein the individual deflectors and the common deflectors are typically provided as octupoles or even higher order multipoles, allow for a flat field of view during the scanning of all beamlets. As described further below, one or more condenser lenses can be integrated to adjust the overall probe current in the electron optical beam device.

The charged particle beam device 100 shown in FIG. 4 includes a secondary electron optics according to yet further embodiments described herein. Particles released from or backscattered from the specimen form a secondary beam carrying information about the specimen. Thereby, the information can include information about the topography of the specimen, the chemical constituents, the electrostatic potential, and others. In order to inspect defects as fast as possible, the contrast needs to be increased by using an increased amount of information. The secondary beamlets are separated from the primary beamlets by means of a beam separator 414 and enters a beam bender 423. The beam separator can, for example, include at least one magnetic deflector, a Wien filter, or any other means, wherein the electrons are directed away from the primary beam, e.g. due to the velocity depending Lorenz force.

The beam bender 423 deflects the secondary beamlets towards a focusing lens 432. The focusing lens 432 focuses secondary beamlets on a detector element, e.g. detector element 9A, e.g. a sensor (scintillator, pin diode etc.) of a detector assembly 9. The detection system according to embodiments illustrated, for example with respect to FIG. 4, allows to focus the secondary particle bundle on a detector for Bright Field (BF) imaging, to adapt the size of the secondary particle bundle, or to adapt the size of the secondary particle bundle to a segmented detector in order to achieve angular resolution as described in more detail below. According to embodiments, one or more deflectors 434, 436 (see also 438 in FIG. 7) are provided along the path of the secondary beam.

According to an embodiment, a secondary charged particle detection system for a charged particle beam device is provided. The detection system includes a beam splitter for separating a primary beam and a secondary beam formed upon impact on a specimen; a beam bender for deflecting the secondary beam; a focusing lens for focusing the secondary beam; a detection element for detecting the secondary beam particles, and deflection elements. For example, at least a first deflector is provided between the beam bender and the focusing lens, at least a second deflector is provided between the focusing lens and the detection element, at least a third deflector is provided between the beam splitter and the beam bender.

When scanning a large Field of View (FOV) with the primary beam, the SE bundle starts moving accordingly and, in general, the SE bundle is scanning across the sensor. For small sensors this may lead to signal loss towards the edges of the FOV. In angular filtering mode it may result in sensitivity variations across the FOV. In energy filtering mode it may change the filtering threshold across the FOV. To avoid these effects, a de-scanning (anti scan, counter scan) signal needs to be applied to the SE bundle by the SE optics according to embodiments described herein, where for example three deflectors (see FIG. 7) are provided for improved SE signal capturing.

According to embodiments described herein, the beam bender 423 includes at least two curved electrodes. For example, two curved electrodes 424 and 425 are shown in FIG. 4. The curved electrodes can be electrodes curved in one direction. According to another embodiment, the beam bender can be a hemispherical beam bender. The beam bender includes two approximately spherical and approximately concentric electrodes creating a large angle deflection field with approximately stigmatic focusing, if properly excited by two voltages ($V_{bend\,pos}$ and $V_{bend\,neg}$).

According to an embodiment, the beam bender voltages are set such that the required total deflection angle, e.g. 90°, is reached and the focusing is approximately stigmatic. Also other bending angles are possible if mechanical boundary conditions require different angles. Angles between 60° and 120° can be beneficial. The beam bender typically focuses the first SE crossover above the objective lens stigmatically into a second crossover in front of the SE focus lens. This is a rough alignment onto the optical axis of the SE focus lens after the secondary beam exits the beam bender.

Figure 5A:
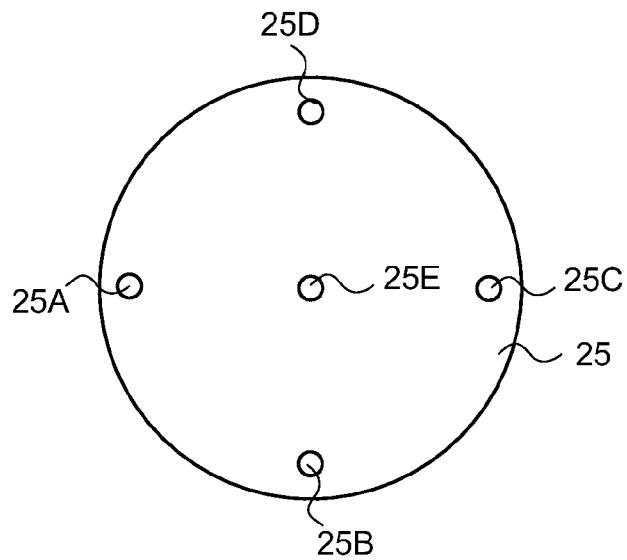
FIGS. 5A and 5B show schematic views of a further aperture plate and individual deflectors according to embodiments described herein.
Figure 5B:
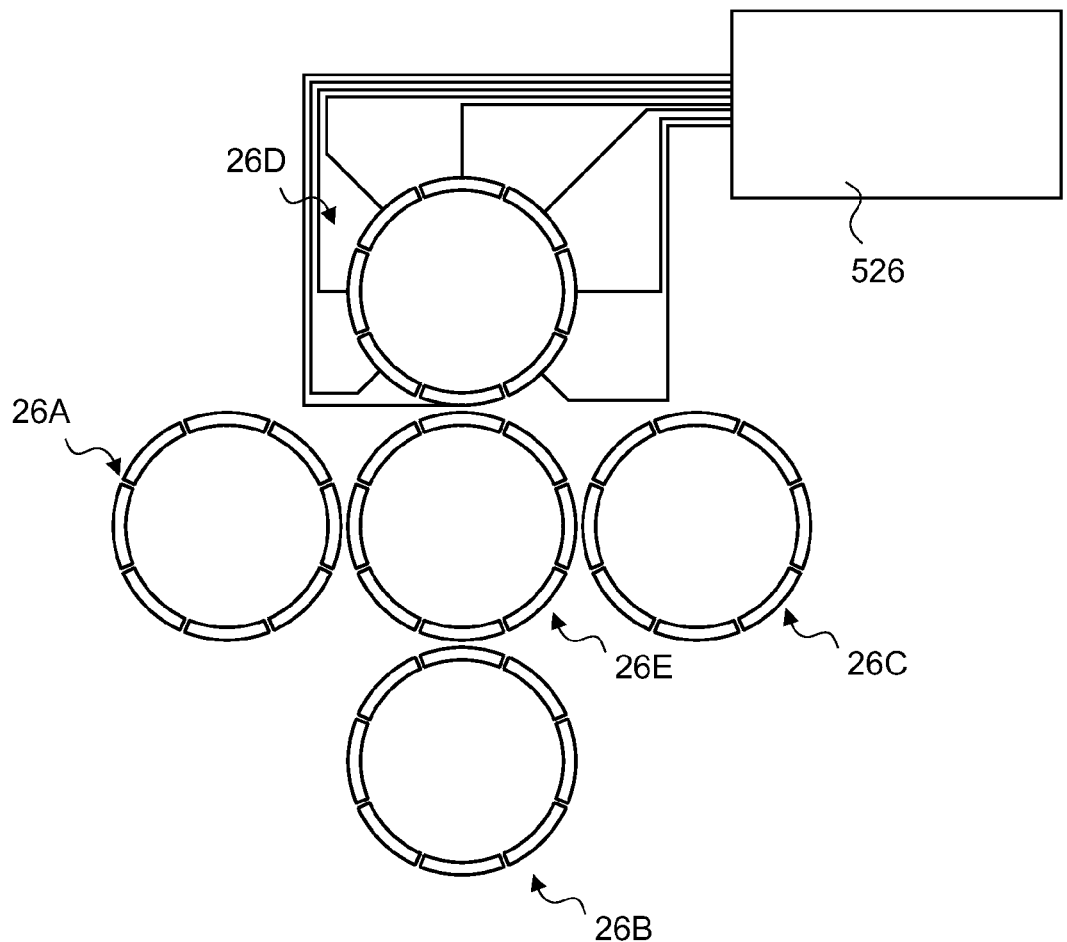

Another example of an aperture plate 25 having aperture openings 25A-25E and a corresponding arrangement of deflectors 26A-26E is illustrated in FIGS. 5A and 5B. According to embodiments described herein, an electron beam, after leaving a charged particle source, e.g. charged particle source 2 in FIG. 4, passes through the aperture plate 25 having e.g. five apertures 25A-25E. By passing through the aperture plate 25, five charged particle beams 4A are created. Thereafter, the deflectors 26A-26E are used to influence the beams of charged particles so that each beam appears to come from a different source. The deflectors 26A-26E influence each of the beams individually which leads to a better control of the properties of each individual beam FIG. 5B shows schematically a top view on the deflectors 26A-26E as used e.g. in a column shown in FIG. 4. Thereby, each deflector 26A-26E comprises eight electrodes. Each deflector 26A-26E generates static deflecting fields for correction of the beam paths through the objective lens and for positioning the beams at the specimen. Furthermore, the deflectors 26A-26E can be used for compensation of the aberrations arising from a deviation of the objective lens from the axial symmetry.

According to some embodiments, it is preferred to provide an octupole or even higher order element as deflector elements for embodiments herein. Thereby, for example, each of these multi-poles such as octupoles or even higher order multi-poles, has an electrical supply, which can generate a lens function (common voltage on all electrodes), a deflection function in the x- and y-direction (electrical field in a plane vertical to the optical axis) and a stigmatism function to control the astigmatism of each beamlet (2 electrical quadrupoles rotated by 45°). Optionally an electrical hexapole can be provided either by an additional supply to the octupole, or by the integration of a higher order multi-pole (e.g. 12-pole). Thereby, the above-described advantages can be realized.

As shown in FIG. 5B, a controller 526 can be provided. The controller includes a plurality of power supplies such that the voltages on the electrodes can be controlled. The power supplies can be either connected to electrical circuits for superimposing various voltages, e.g. one common voltage provided to all electrodes with one or more other voltages provided to two or more electrodes in common, or power supplies are connected to each of the electrodes and a software calculates the desired superimposed voltages for each of the electrodes. That is the software superimposes voltages desired for a lens function with voltages desired for a deflection function and voltages desired for a correction function, e.g. an aberration correction function, such as a stigmation correction function, and applies the superimposed voltage to each of the electrodes.

Figure 6A:
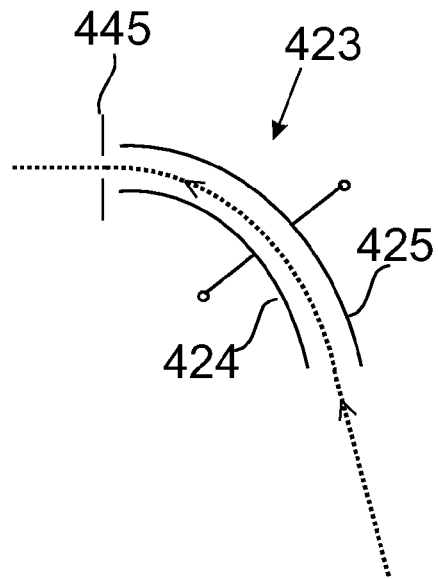
FIGS. 6A and 6B show schematic views of beam benders, which can be used in embodiments described herein.

Further options to provide a beam bender for embodiments described herein, will now be described with respect to FIGS. 6A and 6B. FIG. 6A shows a sector 423. Sector 424 has a negatively-charged U-bend 425 and a positively-charged U-bend 424 serving to bend the electron beam. Optionally, a pair of sector side plates can be provided. Thereby, the electron beam is focused in one dimension and, additionally, is kept at a high energy to avoid time of flight effects which may have impact on high-speed detection. A focusing in the second dimension takes place in quadrupole element 445. Thereby, the sector 423 and the quadrupole form a double-focusing sector unit. Further, it may be possible to use a cylinder lens instead of a quadrupole to obtain double focusing.

Figure 6B:
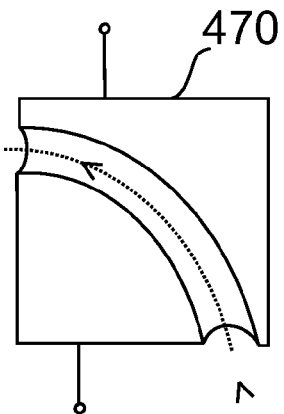

In the further embodiment of FIG. 6B, a hemispherical sector 470 is used. In view of the hemispheric shape, the electron beam entering the sector is focused in both dimensions. Thus, no additional focusing unit is required to provide a double-focusing sector unit. According to a further embodiment (not shown) the focusing of the double focusing sector unit (425, 445 in FIG. 6A or 470 in FIG. 6B) can be assisted with an additional focusing unit. Thus, the double focusing sector unit may also include additional lenses, for example an Einzel-lens.

Generally, an electrostatic beam bender can be either cylindrical or hemispherical. The cylindrical type suffers from the fact that as the beam is bent the secondary electrons are focused in one plane and not in the other. A hemispherical beam bender focuses the secondary beam in both planes. The cylindrical sector can be used with side plates biased to achieve focusing in the transverse plane, yielding to similar focusing properties to those of the hemispherical sector.

Figure 7:
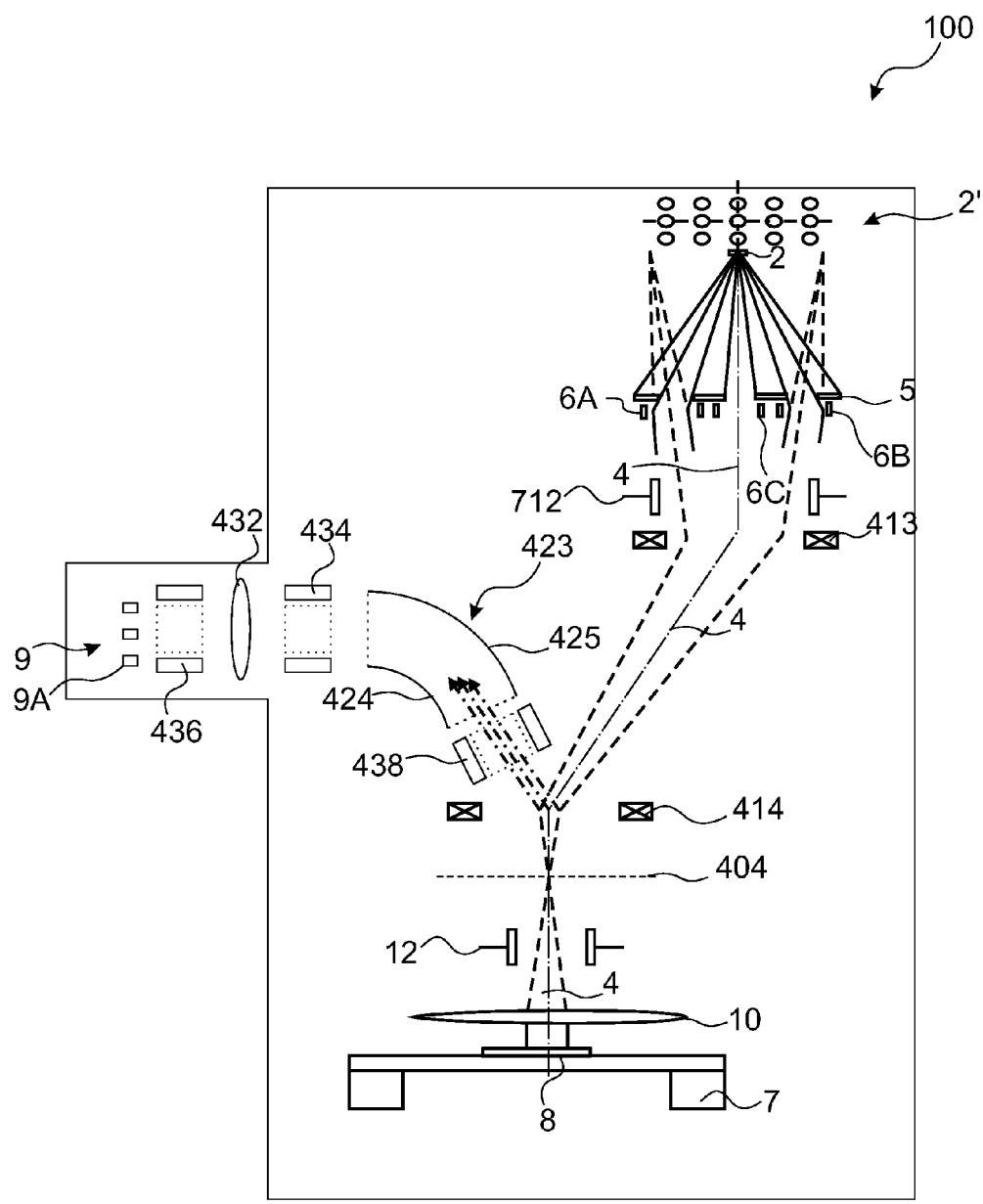
FIG. 7 shows a schematic view of another charged particle beam device having an aperture plate, individual deflectors, and a scanning deflector assembly according to embodiments described herein.

According to yet further embodiments, which can be combined with other embodiments described herein, a 2-stage scan deflection arrangement can be provided. FIG. 7 illustrates an exemplary embodiment including a first scanning deflector 712 and a second scanning deflector 12, wherein the second scan deflector corresponds to the previously mentioned scanning deflector 12 shown e.g. in FIGS. 1 and 4. A condenser lens (not shown in FIG. 7) can be included according to any of the embodiments described herein. According to typical embodiments, the first (upper) scanning deflector 712 can be provided between the aperture plate and a first beam separation element, e.g. magnet deflector 413 in FIG. 7. However, it is also possible that the $1^{st}$ stage, i.e. the upper scanning deflector 712 is located further up in the beam path, e.g. in a condenser lens, which is exemplarily shown in FIG. 9. For embodiments having a 2-stage scan deflection assembly, the first (upper) deflector can be an electrostatic octupole, which not only acts as a prescan deflector but also as a stigmator. Thereby, the first scan deflector, e.g. scanning deflector 712 in FIG. 7, corrects the global astigmatism of the condenser lens or the like. 2-stage scanning configurations have the advantage that the pivot point of scanning can be aligned along the optical z-axis. Accordingly, off-axis lens aberrations (in particular coma) within the scan field can be minimized. This will result in a large field of view of each beamlet scan field without or with only small spot size degradation.

The one or more scanning deflectors are thereby configured for high speed scanning, e.g. to achieve a pixel rate in the GHz region (e.g. 3 GHz or above) and/or a line rate in the MHz region (e.g. 3 MHz or above). Thus, the scanning deflectors can for example be electrostatic deflectors. According to typical embodiments, which can be combined with other embodiments, the frequency of the control signal provided by the controller to the deflector is 0.1 MHz to 10 MHz.

Another alternative or additional modification to yield yet further embodiments is shown in FIG. 7. Thereby, a third deflector 438 is provided in the signal electron beam path. The third deflector 438 is adapted to generate orthogonal deflection fields with the ability to add a counter scan signal. The first deflector 434 is adapted to generate orthogonal dipole deflection fields. The generation of higher order multi-poles in this element might not be highly effective, since a SE-crossover is formed near the element. However, it could also have a larger number of poles, e.g. 8, because a potential correction can be conducted before the SE beams enter the focusing lens 432. According to an embodiment, the second deflector 436, i.e. the deflector provided between lens 432 and detector assembly 9, generates orthogonal dipole fields for alignment purposes, but can also produce a hexapole component if the hexapole of the beam bender should be reduced.

According to yet further embodiments, which can be combined with other embodiments described herein, an extraction field for the signal electrons is provided above the specimen. For example, the extraction field can be 0.5 kV/mm or above, such as about 1kV/mm. The extraction field focuses the signal beamlets before they mix with each other. Accordingly, crosstalk can be reduced by the extraction field and a detector detects only the signal electrons generated by one primary beamlet. As an additional or alternative solution to reduce cross-talk, a small working distance of e.g. 0.2 mm to 2 mm can be provided, wherein a short focal length of the objective lens 10 is provided. Yet, the working distance might be more difficult to control as compared to the extraction field. However, a combination of both improvements can be provided, wherein the working distance is only slightly reduced to e.g. 0.5 mm or above. In order to provide an extraction field an additional electrode, a so-called proxi-electrode, can be provided. Exemplary embodiments will now be described with respect to FIG. 8.

Figure 8:
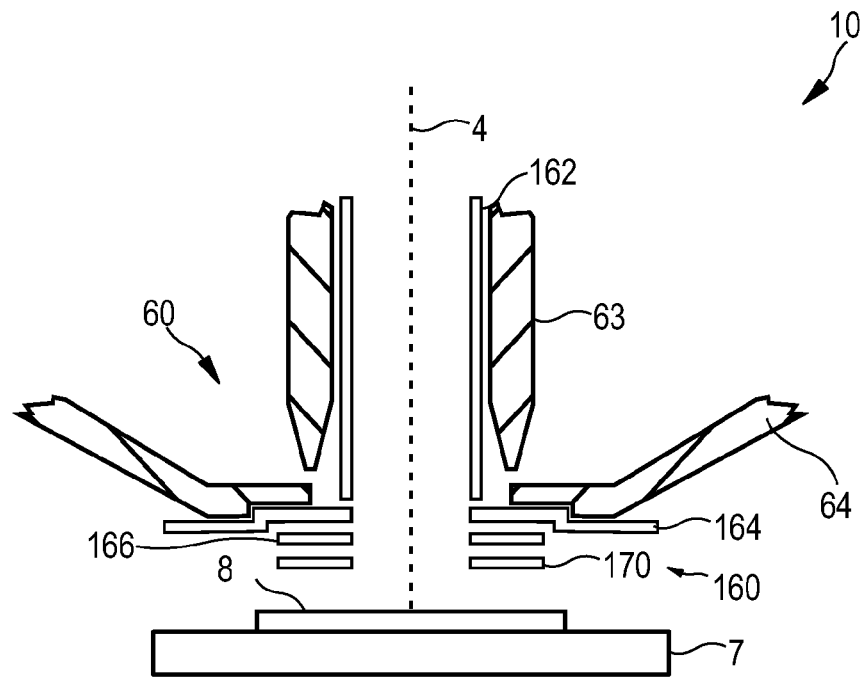
FIG. 8 shows a schematic view of a portion of the objective lens which can be used in embodiments described herein.

According to embodiments described herein, the objective lens for an electron beam system, i.e. the last lens before the electron beam impinges on the specimen or wafer, includes a combined electrostatic and magnetic lens. As shown in FIG. 8, the objective lens 10 includes an electrostatic lens component and a magnet lens component. The electrostatic lens component includes an upper electrode 162, which lies on a high potential and a lower electrode 166, which lies on a potential close to the sample voltage and which decelerates the electrons for providing the desired landing energy. These electrodes contribute to focusing, as well as to slowing down the beam to the required low primary beam voltage. Additionally, a middle electrode 164 and a control electrode 170 for extracting the signal electrons, such as secondary electrons (SE) or backscattered electrons, is provided. Thereby, the desire to provide for a very low landing energy, e.g. 100 eV and a low extraction field, can be provided without deteriorating overall performance of the electron beam imaging system. Even though several electrodes, e.g. four electrodes can be provided as shown in FIG. 8, according to typical embodiments, at least an upper electrode 162, a lower electrode 166 and a control electrode 170 for control of the extraction field, e.g. a proxi-electrode, can be provided.

FIG. 8 shows a portion of a scanning electron microscope. The objective lens 10 includes the magnetic lens component 60 having an upper pole piece 63, a lower pole piece 64 and a coil (not shown in FIG. 1). The objective lens further includes an electrostatic lens component 160 having a first electrode 162, i.e. upper electrode in the figures, optionally a second (middle) electrode 164, and a third electrode 166, i.e. the lower electrode in the figures. Further, a control electrode 170 for control of the signal electrons or the extraction field acting on the signal electrons respectively is provided at a position along the optical axis 4 from the position of the third electrode 166 to the specimen stage 7 or the specimen 8 respectively.

It is to be understood that the third electrode 166 is sometimes referred to as the proxi electrode or large proxi electrode as it is the closest electrode of the electrostatic lens component 160 to the specimen or the specimen stage. Further, the control electrode for extracting the signal electrons from the specimen is sometimes referred to as the small proxi as it is typically the closest electrode of the electron beam imaging system to the specimen or specimen stage. According to some embodiments, the small proxi can be at the same distance from the specimen as the large proxy. Typically, according to other embodiments, the small proxi is closer to the specimen than the large proxi.

According to the embodiments described herein, it is understood that the small proxi, i.e. the control electrode 170, has a small influence on the properties of the electrostatic lens component 160, yet is sufficiently small enough to be considered an individual element with the functionality to control the extraction of the SEs from the specimen or the guidance of SEs released from the specimen.

The objective lens 60 focuses the electron beamlets, which travel in the column along optical axis 4, on the specimen 8, i.e. in a specimen plane. The specimen 8 is supported on a specimen support table 7. According to some embodiments, which can be combined with other embodiments described herein, the objective lens can also be a magnetic lens and further a radial gap lens. According to some embodiments, which can be combined with other embodiments described herein, scanning of an area of the specimen can be conducted by movement of the table in a first direction essentially perpendicular to the optical axis and by scanning lines in another, second direction essentially perpendicular to the optical axis and essentially perpendicular to the first direction.

Figure 10A:
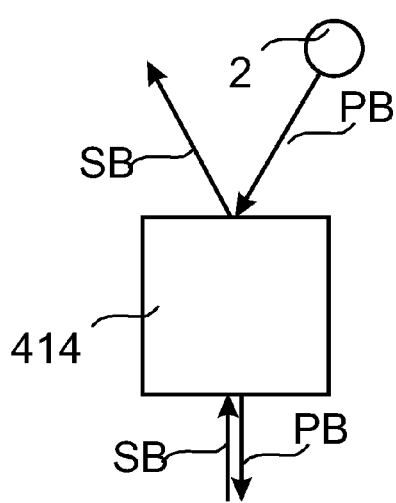
FIGS. 10A and 10B, show schematic views of beam separators according to embodiments described herein.
Figure 10B:
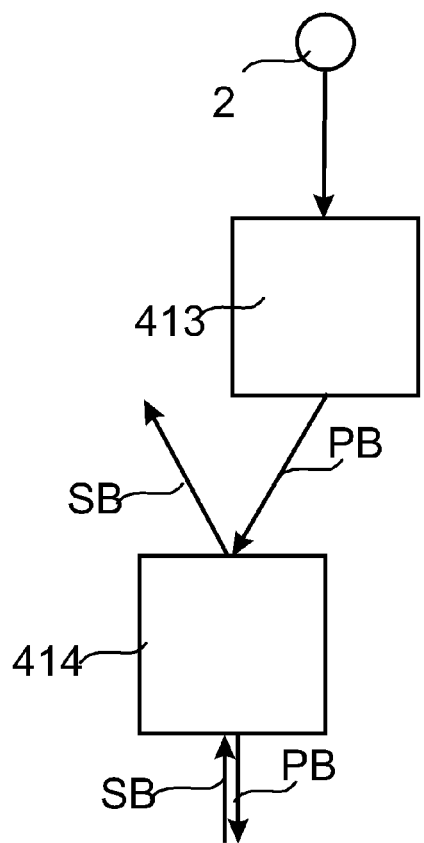

As already schematically explained with respect to FIG. 1, embodiments described herein, typically include a beam separator for separating the primary beamlets from the path of the signal electron beamlets. Accordingly, the signal beamlets can be detected completely separated from and without interaction with the primary beamlets. According to various embodiments, different options of beam separation can be provided. A beam separator can be a 1-B separator, i.e. a beam separator with one magnetic field as shown in FIG. 10A. A beam separator can be a 2-B separator, i.e. a beam separator with 2 magnetic fields as shown in FIG. 10B, a 2-B separator with dispersion correction, a 2-B separator with a tilted upper part of the column for dispersion correction, or any of the above-mentioned 2-B separators having an additional signal electron bender to increase the bending angle, e.g. to 45° to 90°. For example, as described with respect to FIGS. 6A and 6B, the electron beam bender can be a spherical, i.e. hemispherical or cylindrical benders. Yet further, additionally or alternatively mirror arrangements can be used to increase the bending angle of the signal electron beamlets. According to yet further options, a beam separator can include crossed electrostatic-magnetic fields (see, e.g. FIGS. 11A and 11B), e.g. in a Wien Filter like arrangement. Thereby, the electric and magnetic deflection fields can be superimposed or arranged one after the other along the optical axis 4. Specific examples are a Wien Filter configuration with a straight primary beam (see, e.g. FIG. 11A), a deflected secondary beam and an achromatic (or at least partial achromatic) arrangement of crossed electrostatic-magnetic fields for either the primary or the secondary beam. In these cases both primary and secondary beams are deflected.

One method of separating the primary and secondary beamlets is to use magnetic deflection without an electric field. FIG. 10B shows schematically an arrangement of magnetic-beam separator optics in accordance with embodiments described herein. Charged particle source 2, e.g. an electron emitter, produces a primary-electron beam, of which subsequently primary beamlets are generated. The primary beamlets are first deflected by the first magnetic deflector 413 such that primary-electron beamlets enters a second magnetic deflector 414 at an angle. To keep the effect of the magnetic beam separator on the primary beam small, the angle of deflection in the first magnetic deflector 413 should be kept below 10 degrees. Primary-electron beamlets pass through the second magnetic deflector 414 and are directed at specimen. Secondary electrons of the beam are then deflected by the second magnetic deflector 414 such that the total angle α of separation of primary beamlets and secondary beamlets is roughly twice that of the deflection of the primary beam in the first magnetic deflector (e.g. 5 to 20 degrees). This separation is enough to allow a beam bender to be mechanically isolated from the primary beamlets and to be made strong enough to deflect secondary beamlets so that the signal electrons are now traveling with a large angle that is between 30° and 100°, with respect to the primary beamlets.

Figure 11A:
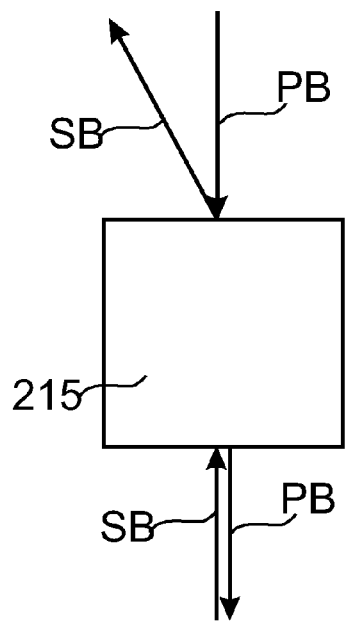
FIGS. 11A and 11B, show schematic views of beam separators according to embodiments described herein.
Figure 11B:
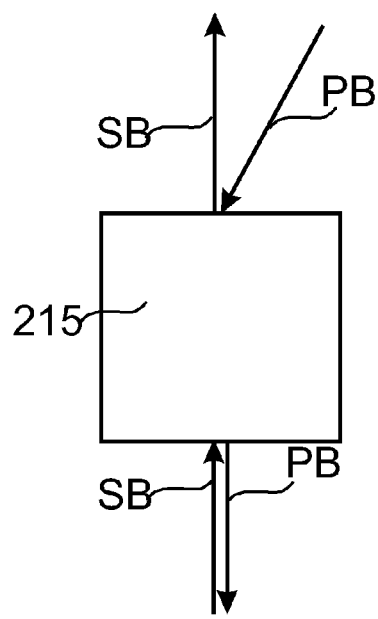

Another possible beam separator is the Wien filter. A Wien filter arrangement in accordance with an embodiment of the invention is shown schematically in FIG. 11A. The primary electron beamlets pass through a Wien-type momentum-dispersive filter 215 and are focused by an objective lens on a sample specimen. Secondary-electron beamlets pass through the objective lens and the Wien-type filter 215 in a direction opposite to that of primary-electron beamlets. The Wien filter can be adapted such that the primary-electron beamlets 210 pass unaffected by Wien filter 215, while secondary-electron beamlets are bent as it passes through Wien filter 215 so that it exits the column inclined with respect to the primary-electron beamlets. A Wien filter uses crossed electric and magnetic fields, the amplitudes of which are adjusted so that there is zero net force on the primary beamlets and a deflection (transverse) force on the secondary beamlets. Generally, the Wien filters 215 shown in FIGS. 11A and 11B are provided as follows. The electric and magnetic fields within the Wien filter are adjusted such that in FIG. 11A the primary charged particle beamlets are unaffected. Contrary thereto, within FIG. 11B, the electric and magnetic fields are adjusted such that the secondary charged particle beamlets are unaffected. Nevertheless, both embodiments utilize the separation of the primary and secondary beam. According to a further option (not shown) it is further possible that both beams are deflected to some degree, whereby a beam separation is achieved.

Figure 9:
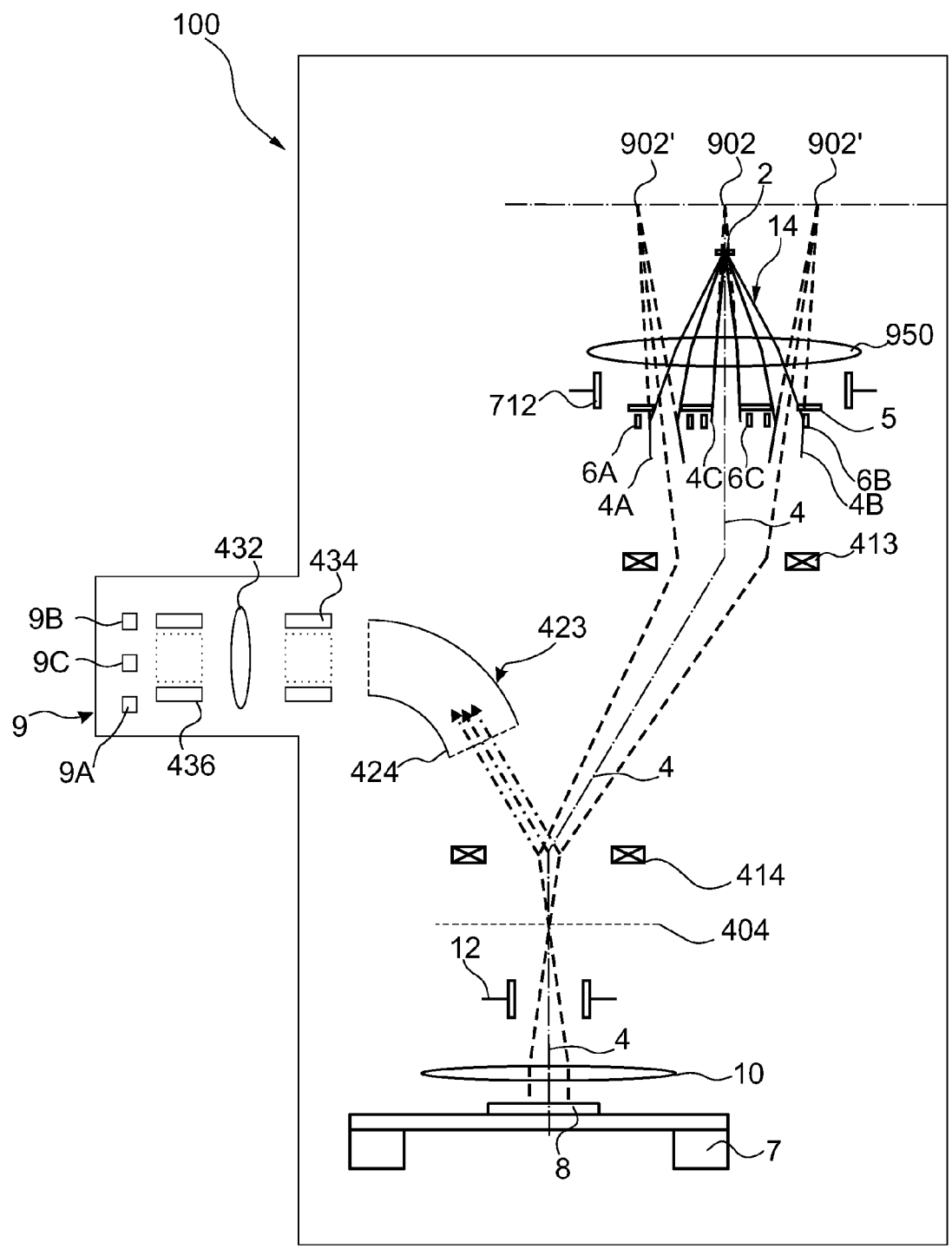
FIG. 9 shows a schematic view of yet another charged particle beam device having an aperture plate, individual deflectors, a scanning deflector assembly, and a condenser lens according to embodiments described herein.

FIG. 9 illustrates another charged particle beam device 100. The charged particle beam device includes a column having the column housing. A charged particle source 2 is provided within the charged particle beam device. According to embodiments described herein, one single charged particle source is provided. The condenser lens 950 illuminates the aperture plate with the charged particle beam 14 such as an electron beam. The resulting beamlets 4A, 4B, and 4C, are deflected by the deflectors 6A, 6B and 6C such that they appear to come from different sources. As shown in FIG. 9, the electrons provided by the source appear to come from the virtual source 902 due to the action of the condenser lens 950. Further, there are sources 902' due to the combined action of the deflectors 6A/B and the condenser lens 950.

According to different embodiments, which can be combined with other embodiments described herein, the aperture plate 5 having the aperture openings and the deflectors 6A, 6B, and 6C can be provided independently from each other or in a module, for example an MEMS module. Typically, the deflectors 6A, 6B and 6C are provided as octupole deflectors or even higher order deflectors. Thereby, individual influencing and correction of the beamlets 4A, 4B and 4C can be provided.

Particularly, according to embodiments described herein, the individual deflectors 6A, 6B and 6C can be operated to direct each of the beamlets through the coma free point of the objective lens. The respective plane is indicated by reference numeral 404. In the detection path, as exemplarily shown in FIG. 9, after beam separation of the secondary beamlets from the primary beamlets, the secondary beamlets can be directed on independent detector elements 9A, 9B, and 9C, for example pin diodes or scintillators, etc., for image generation. Yet further, it is also possible to use a segmented detector or an arrayed detector to provide individual detection of the signal beamlets.

Similarly to the path of the primary beamlets, the secondary beamlet beam path may also include global and/or individual components to improve or optimize the detection efficiency. Alternatively or additionally, elements to generate or enhance a specific contrast can be provided. Such elements can be energy filters or filters filtering the signal beamlets depending on the starting angle on the specimen 8. Typically, topographic contrast, voltage contrast, and/or material contrast can be used to enhance the image contrast. An enhanced image contrast contributes to the higher throughput.

Embodiments described herein combine various concepts to arrive at a charged particle beam device, which brings either in full wafer inspection based on scanning electron beam into reach for industrial utilization with sufficiently high throughput or which results in an outstanding cost of ownership per throughput unit. Thereby, even though some of the features might occur to be unrelated on first sight, the combination of concepts and/or features provides the opportunity for the sufficiently high throughput and/or the improved cost of ownership per throughput unit, which was both previously not possible with one of the concepts of embodiments described herein or even a few of the concepts described herein. According to embodiments described herein, a single charged particle source with an aperture plate having 5 aperture openings or more are provided for primary beamlet generation. Individual deflectors provide the beamlets such that they appear to come from different sources and deflection of the individual beamlets to reduce aberrations can be provided. Thereby, the individual deflectors with a multi-pole having an order of 8 or a higher order allow for correction of individual aberrations. The scanning deflector having a multi-pole having an order of 8 or higher provide a global aberration correction and can for example be provided within the objective lens or close to the objective lens, and, thus, allows for coma-free or coma reduced scanning with a large field of view. A magnetic-electrostatic compound lens in deceleration mode, i.e. a retarding field electrostatic-magnet lens inter alia provides the desired resolution, the landing energies for inspection, and provides an extraction of signal beamlets, which reduces crosstalk. A beam separation, particularly with a beam separator and a beam bender or mirror, allows for detection of individual detectors without disturbing the primary beamlets. This also helps to provide the detection with reduced cross-talk at high throughput. Finally, this concept of an electron beam device can be easily arrayed in an array of charged particle beam devices, such that a sufficient number of primary beamlets can be provided at the desired resolution and with a sufficiently small crosstalk between signal beamlets. Typically, the probe distance, i.e. the minimum distance between two primary beamlets, on the specimen can be 10 µm or larger, e.g. 40 µm to 200 µm, which may correspond to a distance of aperture openings of 70 µm or larger. Yet further, if the minimum number of beamlets is not five primary beamlets but at least two primary beamlets, i.e. two aperture openings, two individual deflectors, and two detection elements, the throughput might not yet be sufficient for industrial full area wafer inspection. In light of the outstanding resolution of such a multi-beam device in addition with the comparable ease of manufacturing the components, the cost of ownership per throughput unit can be significantly improved as compared to other systems.

According to some embodiments described herein, which can be combined with other embodiments described herein, an aperture plate with at least two aperture openings or with at least five aperture openings are provided. Thereby, a multi-aperture plate is provided. Typically, the multi-aperture plate is a one-piece unit. Yet, it may also include two or more pieces. The design of the multi-aperture plate follows different criteria and is design in the context of the overall electron optical ray path. According to some embodiments, which can be combined with other embodiments described herein, the number of aperture openings is at least two or at least five, as explained above. For example, the number can be 9 to 15, such as 9 or 11. The number of aperture openings is typically a compromise between the largest possible total current and the optical performance, in particular the achievable spot size in the largest possible beamlet field. Another boundary condition is the beamlet separation on the sample, which can be e.g. 10 µm or above, such as 40 µm to 200 µm, particularly 40 µm to 60 µm, such as about 50 µm. This minimal distance of two primary beamlets on the specimen is provided to assure signal beamlet separation on the detectors, e.g. to reduce or avoid crosstalk. According to some embodiments, which can be combined with other embodiments described herein, a one-dimensional (line) array or 2-dimensional arrays (e.g. 4×4, 3×3, 4×4, 5×5, etc. or asymmetrical arrays e.g. 2×5) can be provided. The grid configuration, i.e. the positions of the primary beamlets on the specimen and/or the positions of the aperture openings in the aperture plate, can be provided such that during the scan a complete coverage of the substrate surface is achieved. For example, designs as described with respect to FIG. 3 can be used. Thereby, the scanning of the electron beamlets may not only include an e-beam scan e.g. in the x-y-direction but can include a mixed scan operation like an e-beam scan in combination with a stage movement According to some embodiments, which can be combined with other embodiments described herein, the distance of the aperture openings can be determined by the value of the probe separation, which can deliver detection signals with significantly reduced crosstalk or even without. Thereby, it has to be considered that not only the x-y-distance between the apertures in the aperture plate is a relevant factor but also the overall system demagnification, which is defined by the condenser lens assembly and the objective lens, the z-location (position along the optical axis,) of the aperture plate in the optical beam path, and the individual beamlet deflection angle, which not only has to generate the virtual source separation but also has to fulfill other ray trace requirements, e.g. directing the beam through the coma free point of the objective lens, have to be considered. According to some embodiments, which can be combined with other embodiments described herein, the demagnification of a charged particle beam device can be 5-times to 20-times, e.g. about 10-times. According to some embodiments, which can be combined with other embodiments described herein, the distance of the aperture plate can be 50 mm to 200 mm, e.g. 80 mm to 120 mm, such as about 100 mm, from the charged particle source.

According to some embodiments, which can be combined with other embodiments described herein, the diameter of the aperture hole can be from 0.05 mm to 0.2 mm, e.g. about 0.1 mm. The optimized diameter can be determined by the required current per beamlet and the corresponding optimum aperture angle suitable for the optics involved or by the required spot size per beamlet and the corresponding optimum aperture angle. In this optimization process, aberrations from the lenses involved as well as e-e interaction have to be considered. According to some embodiments, which can be combined with other embodiments described herein, the diameter of the aperture plate can be 1 mm to 20 mm, such as 2 to 6 mm.

FIGS. 12A and 12B show different embodiments of arrangements of the condenser lens 950, an aperture plate 5 and individual deflectors for charged particle beam devices according to embodiments described herein. FIG. 12A shows the source 2 and the condenser lens 950 provided between the source and the aperture plate 5. The individual deflectors, for example 6A, 6B and 6C as shown in FIG. 12, are downstream of the aperture plate 5, i.e. the aperture plate is provided between the condenser lens 950 and the individual deflectors. The positioning of the condenser lens 950 as shown in FIG. 12A results in virtual beam sources 902 and 902'. In FIG. 12A, the charged particle source 2, the condenser lens 950, the aperture plate 5 and the individual deflectors are provided in this order. Thereby, the condenser lens magnifies the size of the charged particle source 2 and de-magnifies the aperture angle.

Another example is shown in FIG. 12B. Thereby, the charged particle source 2, the aperture plate 5, the individual deflectors, and that condenser lens 950 are provided in this order. Thereby, also virtual sources 902 and 902' are generated.

Further combinations of aperture plates 5, individual deflectors and one or more condenser lenses are shown in FIGS. 13A and 13B. In FIG. 13A, the charged particle source 2, the aperture plate, a first arrangement of individual deflectors, for example deflectors 6A, 6B, and 6C, the condenser lens 950 and a 2nd arrangement of individual deflectors, for example deflectors 136A, 136B, and 136C, are provided in this order.

FIG. 13B shows yet a further embodiment, which can be combined with other embodiments described herein, and can particularly be used in charged particle beam devices according to embodiments described herein. Thereby, a second condenser lens 1350 is provided. For example, the charged particle source 2, the aperture plate 5, the first condenser lens 950, the individual deflectors, and the 2nd condenser lens 1350 are provided in this order. The second condenser lens provides additional flexibility with respect to source magnification and spot separation on the specimen.

Figure 14:
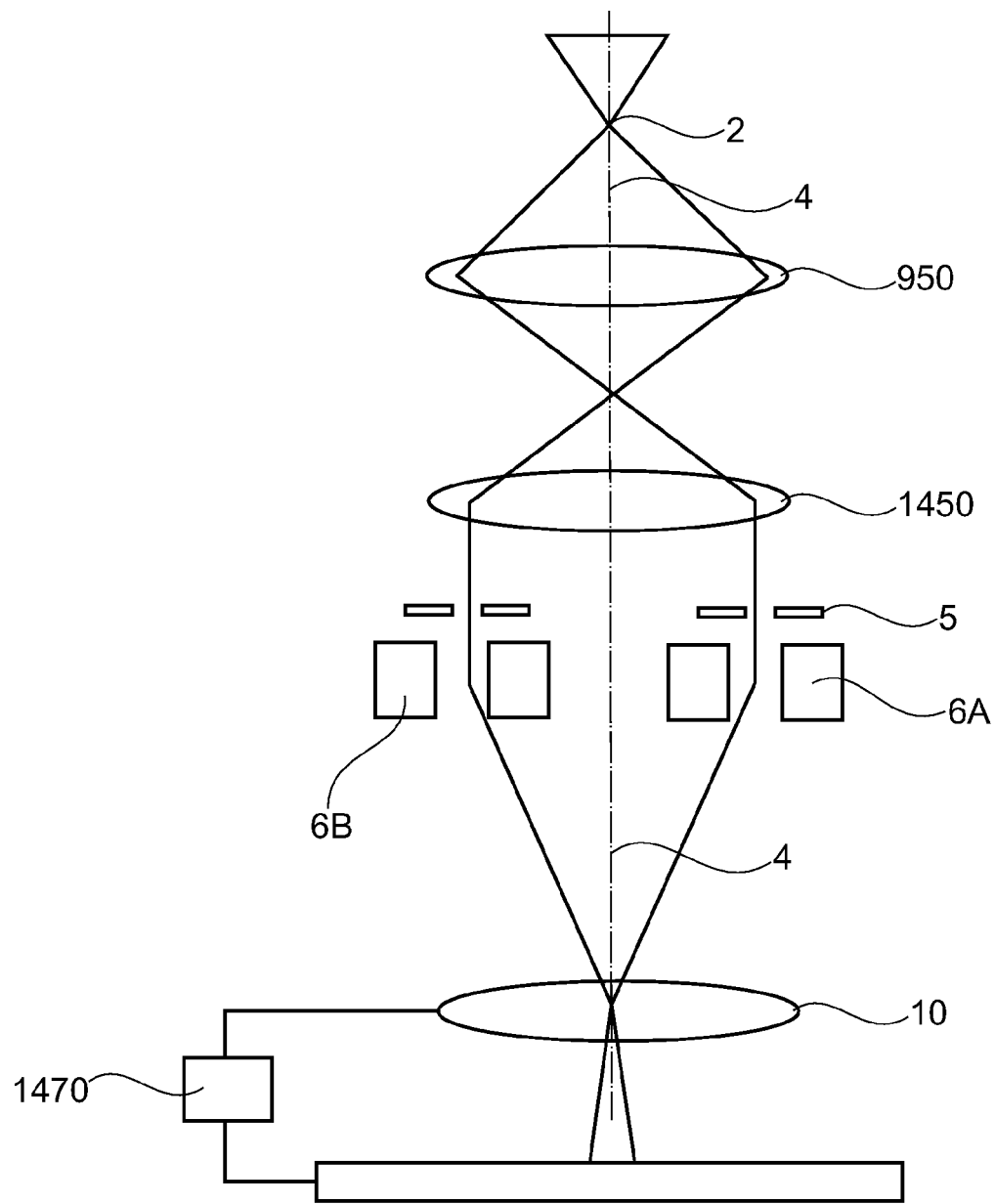
FIG. 14 shows a schematic view of yet another charged particle beam device according to embodiments described herein.

The individual deflectors according to embodiments described herein and which generate the virtual sources i.e. which are used to generate individual primary beamlets by acting as deflectors, can further be used for correction of astigmatism and for individual focusing of the primary beamlets. As described above, according to some embodiments, utilizing one or two condenser lenses can be provided for control of various parameters, such as source magnification, spot separation, source separation. According to some embodiments, a system with two condenser lenses is provided. FIG. 14 shows yet a further exemplary embodiment of a charged particle beam devices having two condenser lenses 950 and 1450. Thereby, the first condenser lens 950 can be utilized to control the de-magnification of the source within the entire system. The second condenser lens 1450 can be provided to generate an essentially parallel beam path of the electron beam emitted by the charged particle source 2. Accordingly, the electrons emitted by the charged particle source 2 have an essentially parallel beam path when entering the aperture plate 5. The aperture plate having aperture openings and the subsequent individual deflectors are provided for generating the virtual sources. The individual deflectors can be used for individual focus correction and/or estimation correction. Thereby, having an essentially parallel electron beam path entering the aperture plate reduces aberrations that can be generated in the lenses defined by the individual deflectors. The primary beamlets are focused in the specimen by objective lens 10. Further, as indicated by power supply 1470, an extraction voltage is provided to extract signal electrons generated on impingement of the primary beamlets. The signal beamlet paths are now shown in FIG. 14 and can be utilized according to any of the embodiments described herein.

While the foregoing is directed to embodiments of the invention, other and further embodiments of the invention may be devised without departing from the basic scope thereof, and the scope thereof is determined by the claims that follow.

The invention claimed is:

1. A scanning charged particle beam device configured to image a specimen, comprising:
   a source of charged particles,
   a condenser lens for influencing the charged particles;
   an aperture plate having at least two aperture openings to generate at least two primary beamlets of charged particles,
   at least two deflectors configured to individually deflect the at least two primary beamlets of charged particles so that each primary beamlet appears to come from a different source, wherein the at least two deflectors are multi-pole deflectors with an order of poles of 8 or higher;

a multi-pole deflector with an order of poles of 8 or higher;
an objective lens configured to focus the at least two primary beamlets onto the specimen, wherein the objective lens is a retarding field compound lens;
a beam separator configured to separate the at least two primary beamlets from at least two signal beamlets;
a beam bender, a deflector or mirror configured to deflect the at least two signal beamlets, wherein the beam bender is selected from the group consisting of: a hemispherical beam bender and a beam bender having at least two curved electrodes; and
at least two detector elements configured to individually measure the at least two signal beamlets.

2. The device according to claim 1, wherein the multi-pole deflector is included in a scanning deflector system for scanning the at least two primary beams of charged particles over the specimen, wherein the scanning deflector system includes at least one scanning deflector, and wherein the at least one scanning deflector is the multi-pole deflector with an order of poles of 8 or higher.

3. The device according to claim 1, wherein the smallest distance of any two aperture openings of the at least two aperture openings is 70 μm or higher.

4. The device according to claim 1, wherein the smallest distance of any two primary beamlets of the at least two primary beamlets on impingement of the specimen is 10 μm or higher.

5. The device according to claim 4, wherein the smallest distance of any two primary beamlets of the at least two primary beamlets on impingement of the specimen is 40 μm or higher.

6. The device according to claim 1, further comprising:
a second condenser lens.

7. The device according to claim 1, wherein the objective lens focuses the source, a cross-over or a virtual source onto the specimen.

8. The device according to claim 2, wherein the scanning deflector system is a 2-stage scanning deflector system including the at least one scanning deflector and a further scanning deflector.

9. The device according to claim 8, wherein the scanning deflector system is an electrostatic scanning deflector system.

10. The device according to claim 1, wherein the at least two deflectors are provided in a MEMS.

11. The device according to claim 1, wherein said aperture openings in said aperture plate are arranged along at least one ring.

12. The device according to claim 11, wherein the aperture openings are further arranged on essentially equidistant lines.

13. The device according to claim 1, wherein said apertures in said aperture plate are arranged in a matrix of at least 3 rows.

14. The device according to claim 13, wherein said apertures in said aperture plate are arranged in a matrix of at least 3 rows and at least 3 columns.

15. The device according to claim 1, wherein the at least two detector elements are arranged to measure the at least two signal beamlets at a beam propagation direction having an angle with respect to the primary beamlets of at least 30°.

16. The device according to claim 1, wherein the column comprises a beam selector for selecting the number of charged particle beams used to examine the specimen.

17. The device according to claim 1, wherein the number of aperture openings is 5 or more.

18. An arrayed scanning charged particle beam device, comprising:
at least two scanning charged particle beam devices configured to image a specimen, each scanning charged particle beam device comprises:
a source of charged particles,
a condenser lens for influencing the charged particles;
an aperture plate having at least two aperture openings to generate at least two primary beamlets of charged particles,
at least two deflectors configured to individually deflect the at least two primary beamlets of charged particles so that each primary beamlet appears to come from a different source, wherein the at least two deflectors are multi-pole deflectors with an order of poles of 8 or higher;
a multi-pole deflector with an order of poles of 8 or higher;
an objective lens configured to focus the at least two primary beamlets onto the specimen, wherein the objective lens is a retarding field compound lens;
a beam separator configured to separate the at least two primary beamlets from at least two signal beamlets;
a beam bender, a deflector or mirror configured to deflect the at least two signal beamlets, wherein the beam bender is selected from the group consisting of: a hemispherical beam bender and a beam bender having at least two curved electrodes; and
at least two detector elements configured to individually measure the at least two signal beamlets.

19. A arrayed scanning charged particle beam device configured to image a specimen, comprising:
at least five scanning charged particle beam devices configured to image a specimen, each scanning charged particle beam device comprises:
a source of charged particles,
a condenser lens for influencing the charged particles;
an aperture plate having at least five aperture openings to generate at least five primary beamlets of charged particles, wherein the smallest distance of any two aperture openings of the at least two aperture openings is 70 μm or higher,
at least five deflectors configured to individually deflect the at least five primary beamlets of charged particles so that each primary beamlet appears to come from a different source, wherein the at least two deflectors are multi-pole deflectors with an order of poles of 8 or higher;
a scanning deflector system for scanning the at least five primary beams of charged particles over the specimen, wherein the scanning deflector system includes at least one scanning deflector, and wherein the at least one scanning deflector is a multi-pole deflector with an order of poles of 8 or higher
an objective lens configured to focus the at least five primary beamlets onto the specimen, wherein the objective lens is a retarding field compound lens;
a beam separator configured to separate the at least five primary beamlets from at least five signal beamlets;
a beam bender, a deflector or mirror configured to deflect the at least five signal beamlets, wherein the beam bender is selected from the group consisting of: a hemispherical beam bender and a beam bender having at least two curved electrodes; and
at least five detector elements configured to individually measure the at least five signal beamlets.

20. The device according to claim 19, wherein the scanning deflector system is a 2-stage scanning deflector system including the at least one scanning deflector and a further scanning deflector.

* * * * *

UNITED STATES PATENT AND TRADEMARK OFFICE
CERTIFICATE OF CORRECTION

PATENT NO. : 9,035,249 B1  
APPLICATION NO. : 14/174651  
DATED : May 19, 2015  
INVENTOR(S) : Frosien et al.

Page 1 of 1

It is certified that error appears in the above-identified patent and that said Letters Patent is hereby corrected as shown below:

In the specification:

Column 5, Line 34, delete "300 to" and insert --300 µA-- therefor.

Signed and Sealed this  
Tenth Day of November, 2015

Michelle K. Lee  
*Director of the United States Patent and Trademark Office*